(12) United States Patent  
Martin et al.

(10) Patent No.: US 7,026,821 B2
(45) Date of Patent: Apr. 11, 2006

(54) TESTING MEM DEVICE ARRAY

(75) Inventors: Eric T. Martin, Corvallis, OR (US); Adam Ghozeil, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 26 days.

(21) Appl. No.: 10/825,882

(22) Filed: Apr. 17, 2004

(65) Prior Publication Data

US 2005/0231204 A1 Oct. 20, 2005

(51) Int. Cl.
*G01R 31/327* (2006.01)

(52) U.S. Cl. ...................... 324/415; 324/418
(58) Field of Classification Search ............. 324/415, 324/418, 419, 434; 714/42
See application file for complete search history.

(56) References Cited

U.S. PATENT DOCUMENTS

| | | | | |
|---|---|---|---|---|
| 4,918,390 A | * | 4/1990 | Ziv et al. | 324/415 |
| 6,459,524 B1 | * | 10/2002 | Zhang et al. | 359/290 |
| 6,600,591 B1 | * | 7/2003 | Anderson et al. | 359/291 |
| 6,750,152 B1 | * | 6/2004 | Christenson et al. | 438/735 |
| 6,750,655 B1 | * | 6/2004 | Staple et al. | 324/415 |
| 6,775,048 B1 | * | 8/2004 | Starkweather et al. | 359/291 |
| 2002/0120887 A1 | * | 8/2002 | Hughes et al. | 714/42 |
| 2002/0174386 A1 | * | 11/2002 | Bucksch et al. | 714/42 |
| 2003/0228051 A1 | * | 12/2003 | Gleason et al. | 382/149 |
| 2004/0218334 A1 | * | 11/2004 | Martin et al. | 361/139 |
| 2004/0257086 A1 | * | 12/2004 | Montrose et al. | 324/420 |

OTHER PUBLICATIONS

Computer Desktop Encyclopedia entry for "MEMS," copyright 1981-2004, version 17.4, 4th Quarter 2004.

* cited by examiner

*Primary Examiner*—Anjan Deb

(57) ABSTRACT

A system of an embodiment of the invention includes an array of micro-electromechanical (MEM) device assemblies and a testing mechanism situated outside of the array of the MEM device assemblies. Each MEM device assembly includes a MEM device capable of being individually written to, but incapable of being electrically read. The testing mechanism tests each MEM device assembly for proper operation without directly reading the MEM device of the MEM device assembly.

28 Claims, 8 Drawing Sheets

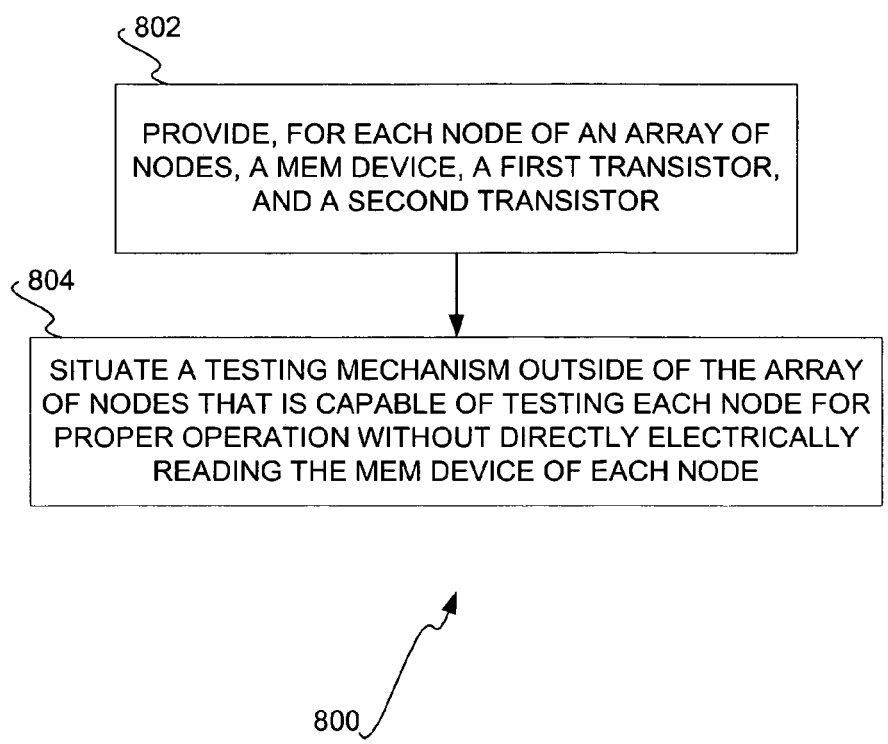

TESTING MEM DEVICE ARRAY

BACKGROUND

Projectors are generally devices that integrate light sources, optics systems, electronics, and displays for front- or rear-projecting images from computers or video devices. Typical projectors include spatial light modulators (SLM's) to modulate light spatially, so that images are projected onto screens for viewing. Light is transmitted to an SLM, which processes the light so that the desired image pixel is projected onto a screen. The principle of operation of SLM's may be based on light reflection, light transmission, light interference, and/or another principle. There is typically one pixel on each SLM in the projector for each pixel of image data to be projected. Examples of SLM's include liquid crystal display (LCD) SLM's, diffractive light device (DLD) SLM's, and other types of SLM's. A DLD in particular is a kind of micro-electromechanical (MEM) device.

A number of SLM's corresponding to the pixels needed for a particular resolution are usually utilized within a projection system. If an SLM is defective, the pixel of image to which it corresponds within the projection system will not be properly projected. Therefore, testing of the SLM's of a given projection system is usually accomplished to ensure that the vast majority of them are not defective. However, some types of SLM's, especially those that are implemented as MEM devices, are difficult to test. For example, MEM devices, such as some kinds of DLD's, may be able to have signals electrically written thereto, but may not be able to have signals electrically read therefrom. As a result, testing of such MEM devices and the accompanying driver circuitry cannot be easily accomplished to ensure that the pixels to which they correspond will be properly projected.

BRIEF DESCRIPTION OF THE DRAWINGS

The drawings referenced herein form a part of the specification. Features shown in the drawing are meant as illustrative of only some embodiments of the invention, and not of all embodiments of the invention, unless otherwise explicitly indicated, and implications to the contrary are otherwise not to be made.

FIG. 8 is a flowchart of a method of manufacture of a system having an array of MEM device assemblies, such as a projection system like that of FIG. 1, according to an embodiment of the invention.

DETAILED DESCRIPTION OF THE DRAWINGS

In the following detailed description of exemplary embodiments of the invention, reference is made to the accompanying drawings that form a part hereof, and in which is shown by way of illustration specific exemplary embodiments in which the invention may be practiced. These embodiments are described in sufficient detail to enable those skilled in the art to practice the invention. Other embodiments may be utilized and logical, mechanical, and other changes may be made without departing from the spirit or scope of the present invention. The following detailed description is, therefore, not to be taken in a limiting sense, and the scope of the present invention is defined only by the appended claims.

Projection System

Figure 1:
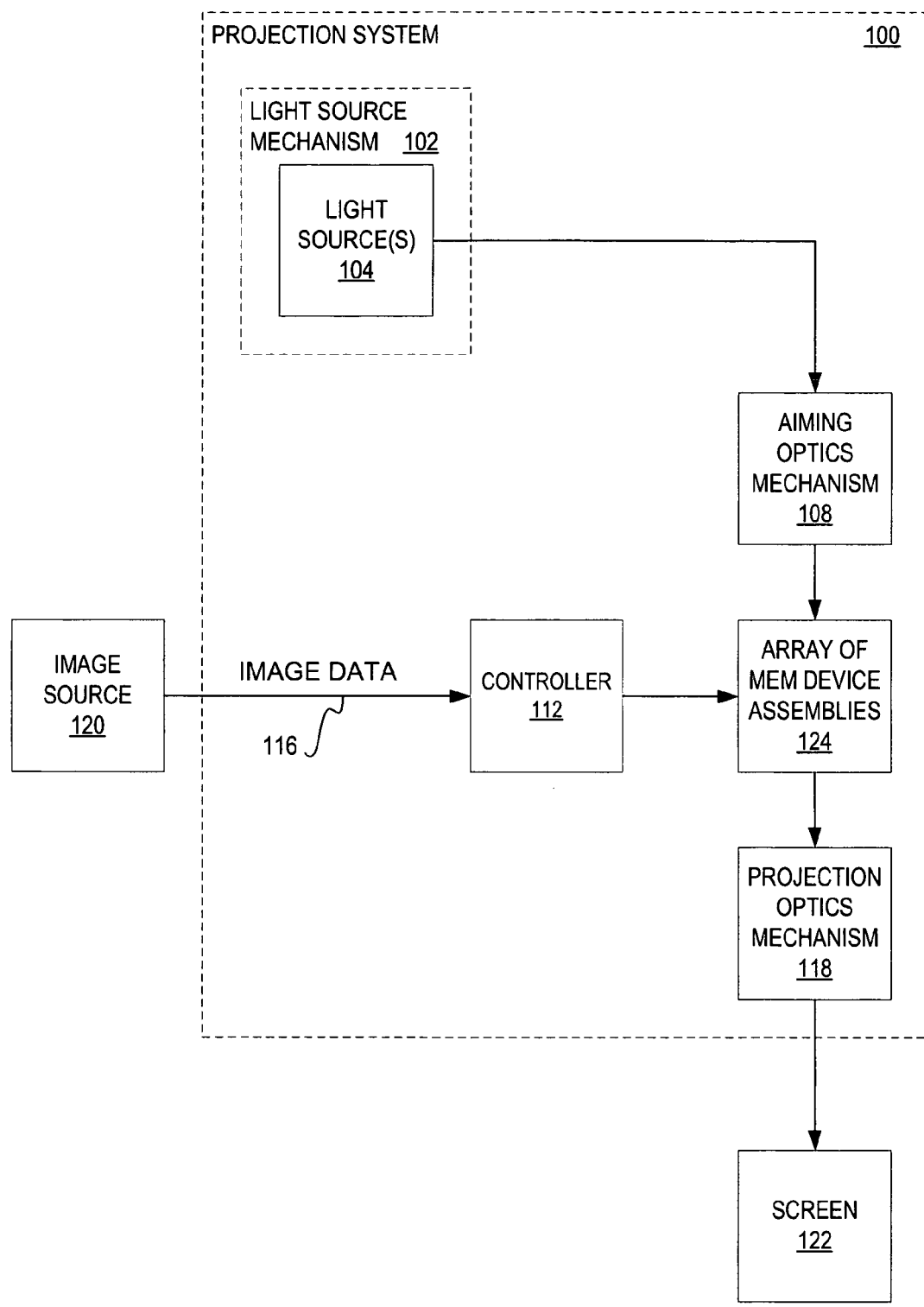
FIG. 1 is a block diagram of a projection system having an array of micro-electromechanical (MEM) device assemblies, according to an embodiment of the invention.

FIG. 1 shows a block diagram of a projection system 100 according to an embodiment of the invention. The system 100 may be implemented as a projector. As can be appreciated by those of ordinary skill within the art, the system 100 includes components specific to a particular embodiment of the invention, but may include other components in addition to or in lieu of the components depicted in FIG. 1. The projection system 100 includes a light source mechanism 102 that includes light sources 104, an optional aiming optics mechanism 108, an array of micro-electromechanical (MEM) device assemblies 124, and a projection optics mechanism 118. The system 100 also includes a controller 112, and is operatively or otherwise coupled to an image source 120 to receive image data 116, as well as a screen 122. Each of the optics mechanisms 108 and 118 may include one or more mirrors, one or more lenses, and/or one or more of other types of constituent components.

The light source(s) 104 of the light source mechanism 102 output light. Each of the light source(s) 104 may be an ultra high pressure (UHP) mercury vapor arc lamp, or another type of light source. For instance, the light source(s) may be other types of light bulbs, as well as other types of light sources such as light-emitting diodes (LED's), and so on. The light output by the light source(s) 104 is for ultimate modulation by the MEM device assemblies 124. The internal or external aiming optics mechanism 108, where present, guides the light as output by the light source(s) 104 to the MEM device assemblies 124 for correct modulation thereby.

The controller 112 controls the MEM device assemblies 124 in accordance with the image data 116 that is received from the image source 120. The image source 120 may be a computing device, such as a computer, or another type of electronic and/or video device. The controller 112 thus enables the projection system 100 to realize a resolution based on the MEM device assemblies 124. The controller 112 in one embodiment particularly sets the MEM device assemblies 124 in accordance with the intensity or other values of the pixels of the image data 116. Furthermore, the controller 112 may scale the image data 116 from one resolution to another.

The MEM device assemblies 124 ultimately modulate the light output by the light sources 104 in accordance with the image data 116 as controlled by the controller 112. The image data 116 may be a still image or a moving image, for instance. The projection optics mechanism 118 projects this light externally or outward from the projection system 100, where it is displayed on the screen 122, or another physical object, such as a wall, and so on. The screen 122 may be a front screen or a rear screen, such that the projection system 100 may be a front-projection system or a rear-projection system, as can be appreciated by those of ordinary skill within the art. The projection optics mechanism 118 guides the light as modulated by the MEM device assemblies 124 outward from the system 100. The user of the projection system 100, and other individuals able to see the screen 122, are then able to view the image data 116.

Figure 2:
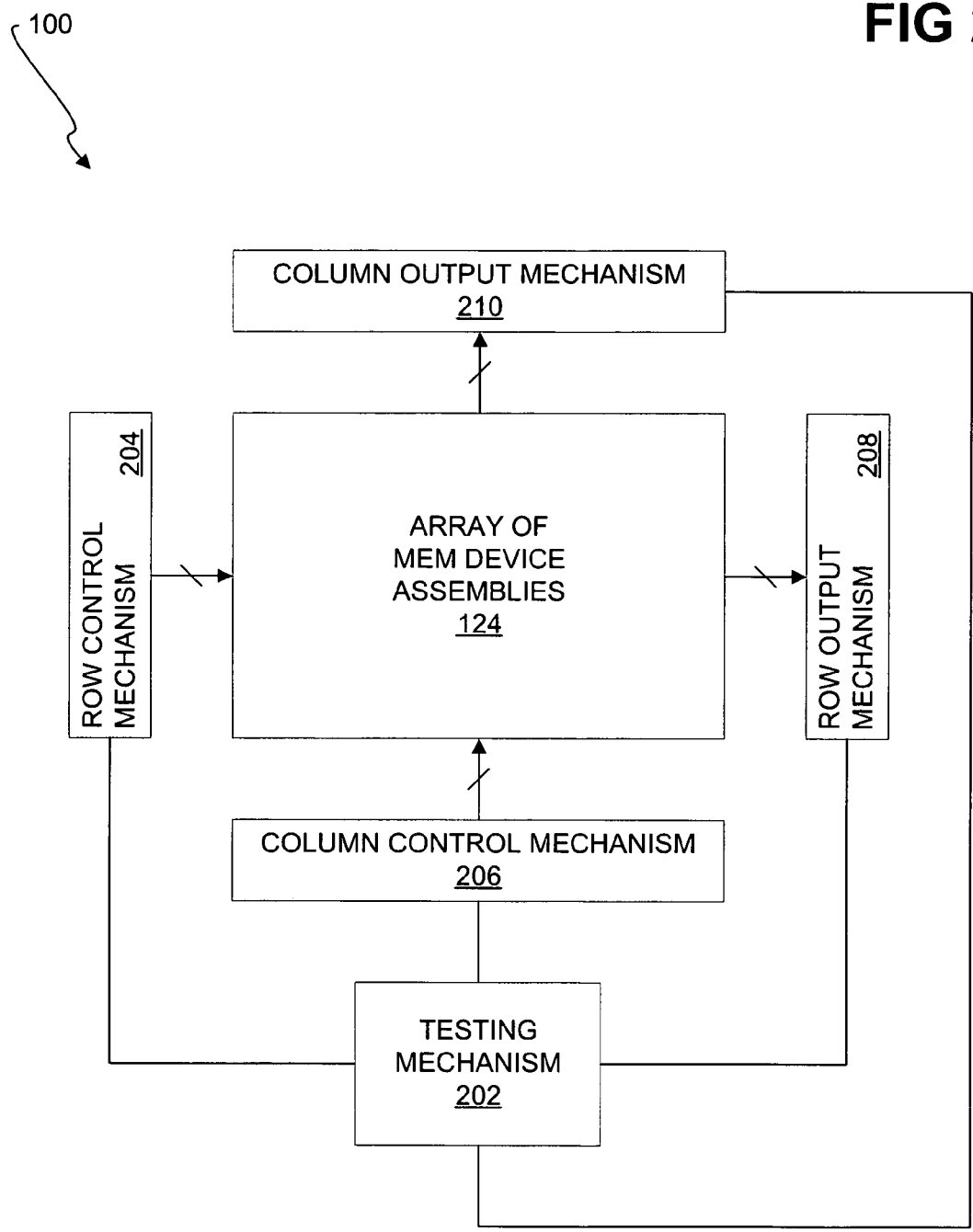
FIG. 2 is a diagram of a portion of the projection system of FIG. 1 in more detail, including a testing mechanism, control mechanisms, and output mechanisms, in addition to the array of MEM device assemblies, according to an embodiment of the invention.

FIG. 2 shows a portion of the projection system 100 of FIG. 1 in more detail, according to an embodiment of the invention. The projection system 100 is depicted in FIG. 2 as additionally including a testing mechanism 202, a row control mechanism 204, a column control mechanism 206, a row output mechanism 208, and a column output mechanism 210, as well as the array of MEM device assemblies 124. The other parts of the projection system 100 depicted in FIG. 1 are not shown in FIG. 2 for illustrative clarity. The testing mechanism 202, the control mechanisms 204 and 206, and the output mechanisms 208 and 210 may in one embodiment be a part of the controller 112 of FIG. 1. Each of the mechanisms 202, 204, 206, 208, and 210 may be hardware, software, or a combination of hardware and software in one embodiment, and includes those components needed to provide functionality as is now described. Furthermore, the hardware for each of these mechanisms may include structures or circuits either on or off the integrated circuit (IC) on which the array of MEM device assemblies 124 have been implemented. The MEM device assemblies 124 may be referred to under the more general nomenclature "nodes" in one embodiment of the invention.

The testing mechanism 202 is situated outside of the array of MEM device assemblies 124, and is capable of testing the circuitry which drives each of the MEM device assemblies 124 without directly reading the assembly, as is described in detail in later sections of the detailed description. Such functionality of the testing mechanism 202 is desirable, because the MEM device assemblies 124 may include MEM devices incapable of being electrically read, although capable of being individually and electrically written. The testing mechanism 202 is further communicatively coupled to the control mechanisms 204 and 206, as well as to the output mechanisms 208 and 210.

The row control mechanism 204 and the column control mechanism 206 allow the testing mechanism 202 to test one or more specific rows and one or more specific columns, respectively, of the array of MEM device assemblies 124, by selecting individual rows and columns of the array 124. For instance, each of the mechanisms 204 and 206 may be or include a multiplexer or multiplexing circuitry in one embodiment. In particular, in one embodiment the row control mechanism 204 is able to charge one or more specific row control signals of the array 124, whereas the column control mechanism 206 is able to charge one or more specific column control signals of the array 124.

The row output mechanism 208 captures row control signals (i.e., receives test results) from the array 124 that can be tested by the testing mechanism 202. Similarly, the column output mechanism 210 captures column control signals (i.e., receives test results) from the array 124 that have can be tested by the testing mechanism 202. Specific embodiments as to how the testing mechanism 202 tests MEM device assemblies of the array 124 without electrically reading the array of MEM device assemblies 124, such that the output mechanisms 208 and 210 receive the results thereof, are described in subsequent sections of the detailed description.

Furthermore, the row output mechanism 208 is able to verify that control signals and/or voltages applied to rows of the array of MEM device assemblies 124 properly propagate over the entire row. As a result, the mechanism 208 is located at the opposite side of the array 124 from that at which the row control mechanism 204 is located, since the row control mechanism 204 applies or generates such control signals and/or voltages. Similarly, the column output mechanism 210 is able to verify that control signals and/or voltages applied to columns of the array 124 properly propagate over the entire column. As a result, the mechanism 210 is located at the opposite side of the array from that at which the column control mechanism 206 is located, since the column control mechanism 206 applies or generates such control signals and/or voltages.

Figure 3:
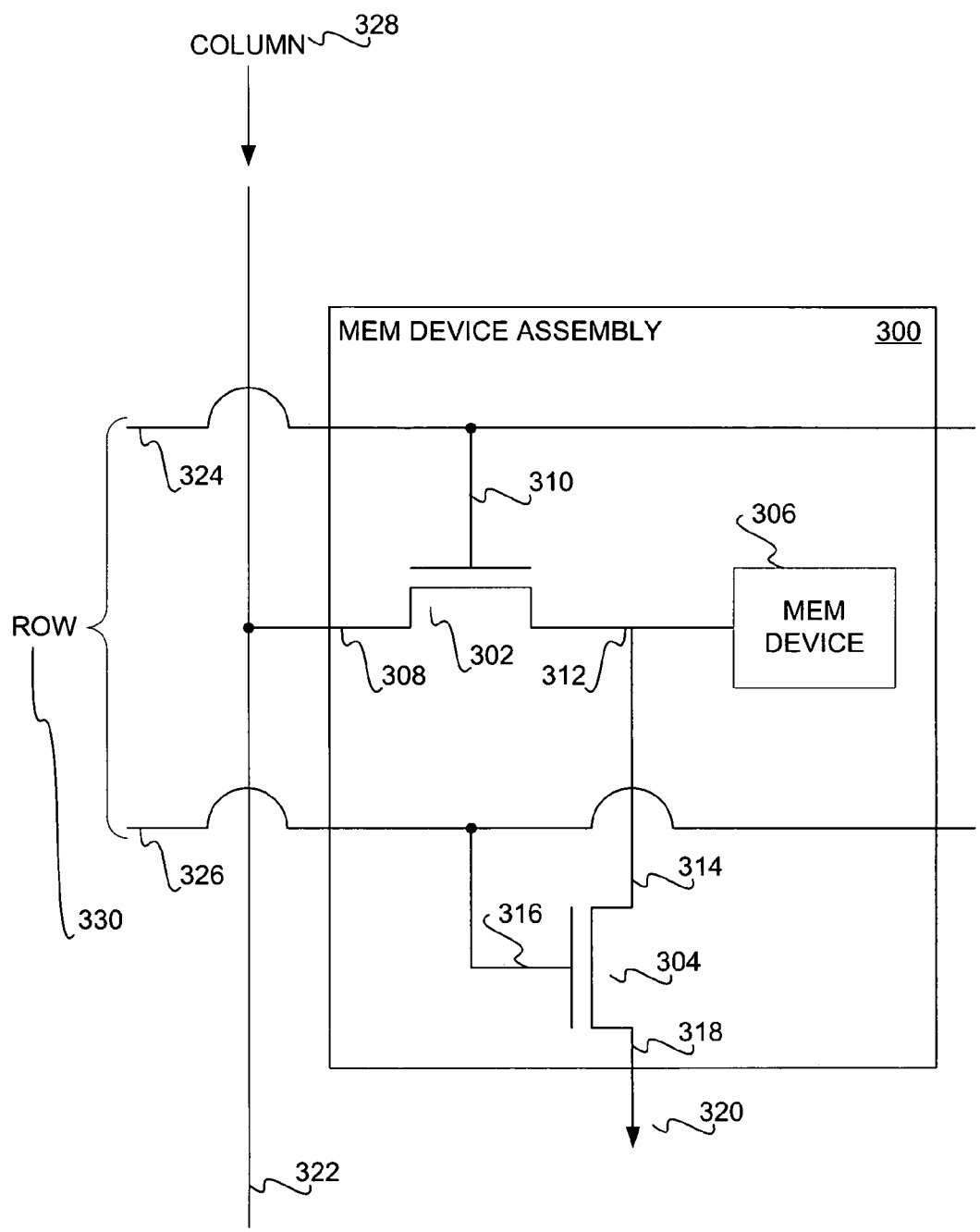
FIG. 3 is a diagram of a representative MEM device assembly, instances of which can implement the array of MEM device assemblies in the projection system of FIGS. 1 and 2, according to an embodiment of the invention.

FIG. 3 shows a representative MEM device assembly 300, according to an embodiment of the invention. Instances of the MEM device assembly 300 may be employed to implement the array of MEM devices 124 of FIGS. 1 and 2 that has been described. The MEM device assembly 300 includes switches 302 and 304, as well as a MEM device 306. In one embodiment the switches may be comprised of metal-oxide semiconductor (MOS) transistors. The MEM device 306 is that which actually modulates the light within the projection system 100 of FIG. 1. The MEM device 306 may operate based on principles of light transmission, light reflection, and/or light interference, among other principles. The MEM device 306 may be a diffractive light device (DLD), or another type of light modulation MEM device.

The MEM device assembly 300 is shown in FIG. 3 as being a part of a column 328 of the array of MEM device assemblies 124, as well as being a part of a row 330 of the array of MEM devices 124. Therefore, there can be more MEM device assemblies that are part of the column 328 than just the MEM device assembly 300, and similarly there can be more MEM device assemblies that are part of the row 330 than just the MEM device assembly 300. The column 328 includes a column line 322. By comparison, the row 330 includes two row lines 324 and 326.

The switch 302 of the MEM device assembly 300 has a source 308, a gate 310, and a drain 312. The source 308 is connected to the column line 322 of the column 328, and the gate 310 is connected to the row line 324 of the row 330. The drain 312 is connected to the MEM device 306. The switch 302 is turned on by asserting a charge on the gate 310, such as by asserting a charge on the row line 324. When the switch 302 is so turned on, column line 322 is electrically coupled to MEM device 306.

The switch 304 of the MEM device assembly 300 likewise has a source 318, a gate 316, and a drain 314. The drain 314 is connected to the MEM device 306 and to the drain 312 of the switch 302. The gate 316 is connected to the row line 326, and the source 318 is connected to a clear voltage 320, such as ground or another type of clear voltage. The switch 304 is turned on by asserting a charge on the gate 316, such as by asserting a charge on the row line 326. When the switch 304 is turned on, the clear voltage is electrically coupled to the MEM device 306.

Therefore, the MEM device assembly 300 in one embodiment of the invention operates as follows. To turn on the MEM device 306 so that it modulates light in a predetermined manner, the row line 324 of the row 330 and the column line 322 of the column 328 are both asserted, or charged, to turn on the switch 302 and to cause the MEM device 306 to receive and store this charge through the switch 302. Thereafter, the row line 324 and the column line 322 are unasserted. When the MEM device 306 is to be cleared, or turned off or erased, the row line 326 of the row 330 is asserted, or charged, to turn on the switch 304 and to cause the charge from the MEM device 306 to drain through the switch 304 and to the clear voltage 320. The schematic of the representative MEM device assembly 300 is for example purposes only, and those of ordinary skill within the art can recognize that different variations can be made to the assembly 300, while maintaining some type of switch coupling of the column line 322 to the MEM device 306, and some type of switch coupling the clear voltage 320 to the MEM device 306.

The MEM device 306 of the MEM device assembly 300 can be individually electrically written to, or charged, by asserting the column line 322 of the column 328 and the row line 324 of the row 330 that uniquely locationally identify the MEM device assembly 300 among the other MEM device assemblies of the array 124. By comparison, the MEM device 306 of the MEM device assembly 300 is electrically erased, or cleared, together with any other MEM devices of MEM device assemblies that are a part of the row 330, by asserting the row line 326 thereof.

In at least some embodiments of the invention, the MEM device assembly 300 is incapable of being electrically read. That is, the current state of the MEM device 306 of the MEM device assembly 300 is unable to be electrically determined. For instance, the MEM device 306 may in one embodiment have two states: an off state in which it does not modulate light, and an on state in which it does modulate light. Whether the MEM device 306 is in the off state or in the on state, however, cannot be determined by sending electrical signals to and receiving electrical signals from the MEM device 306. Rather, the MEM device 306 may have its state determined optically, by examining whether the MEM device 306 is or is not currently modulating light.

That the MEM device assembly 300 is incapable of being electrically read can in one embodiment mean that the MEM device 306 has no associated memory component or location that contains the value to be stored at the MEM device 306. As one example, the array of MEM device assemblies 124 may not have an associated memory component, of which each MEM device assembly within the array 124 would otherwise have an associated location within the memory component to contain the value to be stored at the MEM device 306. However, at least some embodiments of the invention are not limited to such meaning of the MEM device assembly being incapable of being electrically read.

The inability of the MEM device assembly 300 to be electrically read means that testing the MEM device assembly 300, such as the MEM device 306 thereof, for proper operation is difficult to accomplish without resorting to optical testing. The testing mechanism 202 of FIG. 2, however, nevertheless is able to electrically test the circuitry of the MEM device assemblies of the array of MEM device assemblies 124 of FIGS. 1 and 2 without directly electrically reading the charge or voltage stored on the MEM device 306 and without resorting to optics. Two approaches that may be employed by the testing mechanism 202, in various embodiments of the invention, are now described in separate sections of the detailed description.

That is, the MEM device 306 is from an electrical standpoint a write-only memory. A voltage or charge can be written to the MEM device 306, but can be read just optically, via its spatial-light modulation (SLM) properties. Therefore, the embodiments of the invention described in the next two sections of the detailed description provide for testing the circuitry that drives the MEM device 306, such that the MEM device assembly 300 is indirectly tested. Advantageously, such testing allows the MEM devices of the MEM device assemblies 124 to be constructed on silicon wafers, using standard complementary metal-oxide semiconductor (CMOS) processes for the circuitries of the assemblies 124, where the MEM devices may be constructed on top of such circuitries. Electrical testing of the CMOS aspects of the semiconductor wafer can thus be accomplished, and final optical testing of the MEM devices may be performed when the driver circuitries for the MEM devices have already been verified for proper performance. Furthermore, a silicon wafer that has only been processed through the CMOS layers may be tested, where the MEM layers are fabricated over the CMOS layers only if the CMOS circuitry for the wafer passes electrical testing. This provides for more cost-effective manufacturing and testing, because MEM devices are not constructed on a semiconductor wafer that has defective underlying CMOS electrical circuitry.

Verifying Electrical Paths Through MEM Device Assemblies

Figure 4:
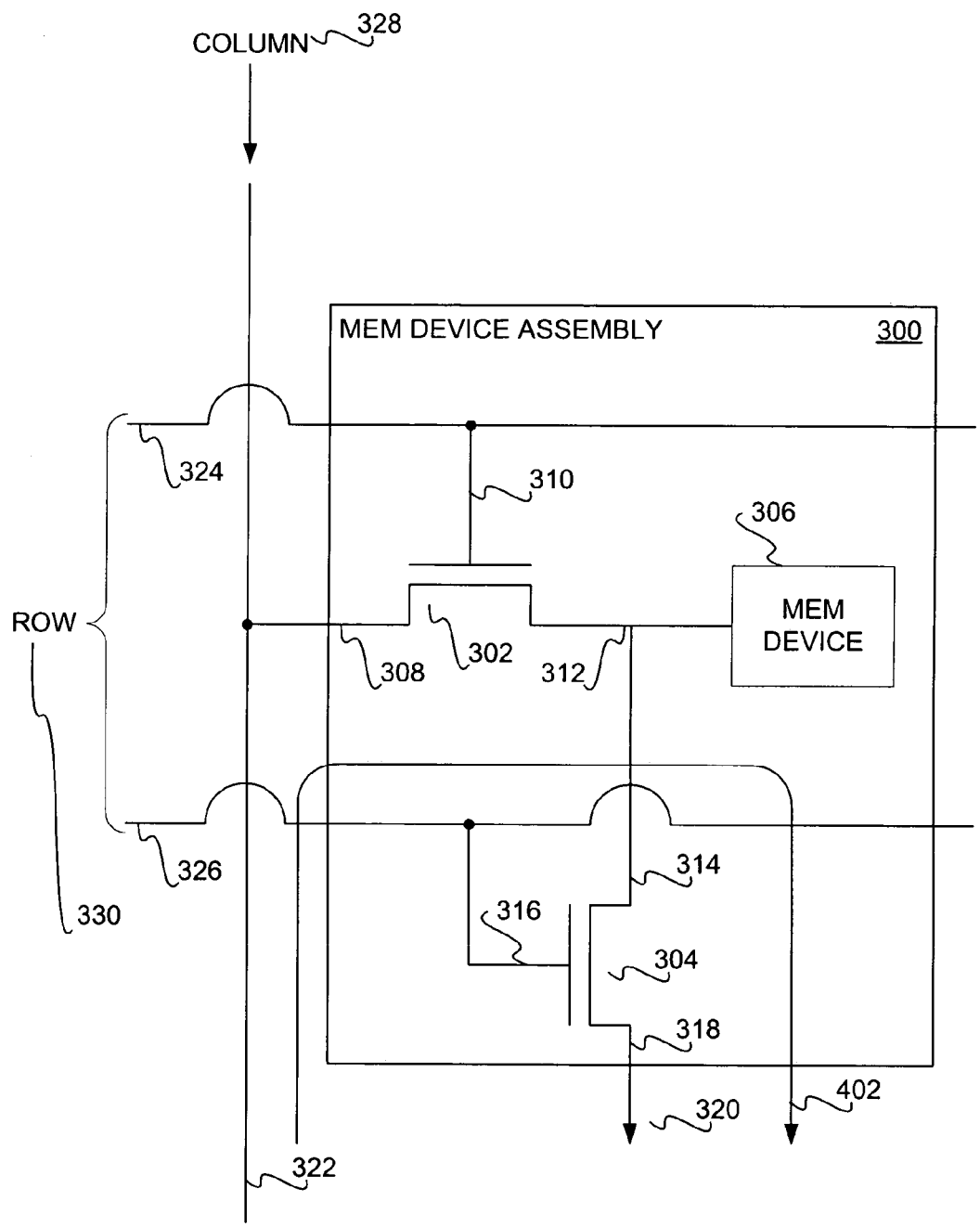
FIG. 4 is a diagram illustratively depicting how the representative MEM device assembly of FIG. 3 can be tested for the existence of an electrical path therethrough, according to an embodiment of the invention.

FIG. 4 illustratively depicts how the testing mechanism 202, in combination with the row control mechanism 204, column control mechanism 206, and the column output mechanism 210, is able to verify that there is an electrical path through the micro-electromechanical (MEM) device assembly 300, according to an embodiment of the invention. For illustrative clarity, however, neither the testing mechanism 202, the control mechanisms 204 and 206, nor the column output mechanism 210 is particularly depicted in FIG. 4. As can be appreciated by those of ordinary skill within the art, the manner by which an electrical path is verified through the MEM device assembly 300 can be repeated for all of the MEM device assemblies of the array 124.

The testing mechanism 202, through the row control mechanism 204, charges, or asserts, the row 330, particularly both the row line 324 and the row line 326 of the row 330. The testing mechanism 202, through the column control mechanism 206, further charges, or asserts, the column 328, particularly the column line 322 of the column 328. Charging of the row line 324 turns on the switch 302 via the gate 310 of the switch 302, whereas charging of the row line 326 turns on the switch 304 via the gate 316 of the switch 304.

As a result of the charging of the row lines 324 and 326 that turns on the switches 302 and 304, there should be an electrical path 402 from the column line 322, from the source 308 of the switch 302 to the drain 312 of the switch 302, through the drain 314 of the switch 304 to the source 318 of the switch 304, and to the clear voltage 320. Because the column line 322 has been charged, an electrical current should flow through the electrical path 402. The electrical path 402 may be communicatively connected to the testing mechanism 202, allowing the testing mechanism 202 to verify that the electrical path 402 is present by measuring current. If no current is flowing, then the electrical path 402 does not exist, and the circuitry associated with MEM device 306 is defective or non-operable.

Figure 5:
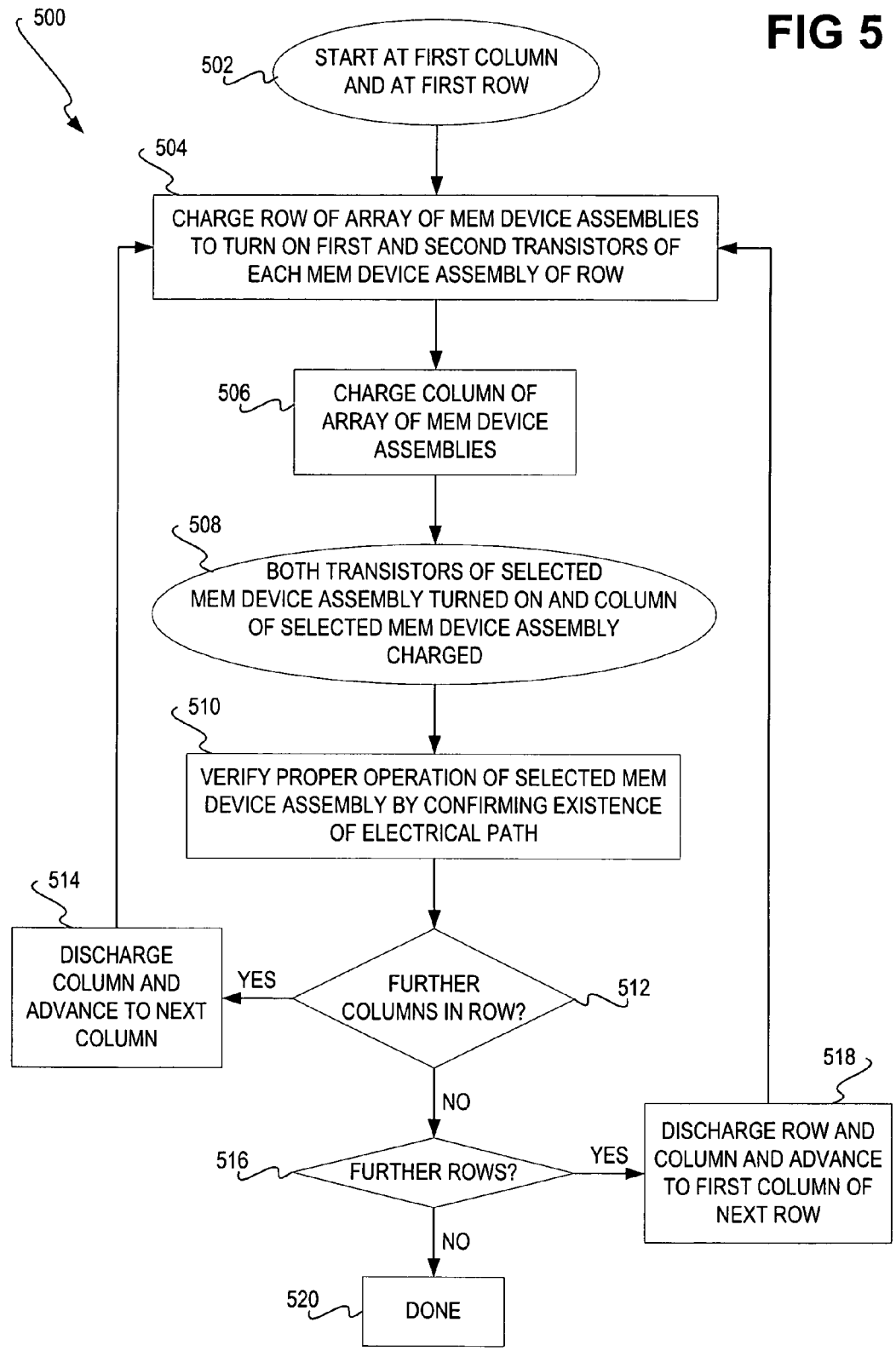
FIG. 5 is a flowchart of a method for verifying the electrical path through each MEM device assembly of an array of MEM device assemblies, according to an embodiment of the invention.

FIG. 5 shows a method 500 for verifying the electrical path through each MEM device assembly of the array of MEM device assemblies 124 by the testing mechanism 202, according to an embodiment of the invention. The method 500 is particularly described in relation to the MEM device assembly 300, for descriptive clarity. The method 500 starts at the first column and at the first row of the array of MEM device assemblies 124 (502).

The first row of the array of MEM device assemblies 124 is charged, or asserted (504), such as by the testing mechanism 202 charging or asserting the row through the row control mechanism 204. In the case of the MEM device assembly 300, charging the row 330 includes charging both the row line 324 and the row line 326. Charging the row lines 324 and 326 turns on both the switches 302 and 304 of the MEM device assembly 300. Furthermore, both transistors of all other MEM device assemblies within the row 300 are turned on.

The first column of the array of MEM device assemblies 124 is also charged, or asserted (506), such as by the testing mechanism 202 charging or asserting the column through the column control mechanism 206. In the case of the MEM device assembly 300, charging the column 328 includes charging the column line 322. Charging the column line 322 places a charge at the source 308 of the switch 302. Of all the MEM device assemblies of the row 330, just the MEM device assembly 300 has both of its transistors turned on and a charge at the source of one of its transistors. This MEM device assembly is the selected MEM device assembly (508).

The testing mechanism 202 next verifies the proper operation of the selected MEM device assembly by confirming the existence of an electrical path therethrough (510). For example, in the case of the MEM device assembly 300, the testing mechanism 202 verifies that the electrical path 402 exists, such as by measuring the current flowing through the path 402. If the electrical path 402 exists, then the testing mechanism 202 concludes that the circuitry associated with MEM device 306 in MEM device assembly 300 is not defective in this regard. The testing mechanism 202 thus is able to test the circuitry associated with MEM device assembly 300 without directly or electrically reading the MEM device 306.

If there are further columns in the current row of MEM device assemblies being tested (512), then the testing mechanism 202 discharges the current column and advances to the next column (514). The method 500 is repeated beginning at 506. Once all of the columns in the current row of MEM device assemblies have been tested (512), if there are further rows of MEM device assemblies (516), then the testing mechanism 202 discharges the current column and the current row, and advances to the first column of the next row (518). The method 500 is repeated beginning at 504. Once all of the columns and rows of MEM device assemblies have been tested (516), the method 500 is finished (520).

The verification performed by the testing mechanism 202 in performing the method 500 ensures that, in the case of the MEM device assembly 300, the electrical path 402 exists when both of the switches 302 and 304 have been turned on. Other types of verification that may be performed, such as relative to the MEM device assembly 300, include confirming that no electrical path exists when the switches 302 and 304 are both off, when the switch 302 is on but the switch 304 is off, and when the switch 304 is on but the switch 302 is off. Furthermore, in varying embodiments of the invention, the testing mechanism 202 may accomplish or perform other verification-oriented functionalities. Such functionalities may include: verifying that the current within the electrical path is within a desired range, to determine that there are no leakage paths that indicate damage or lithography errors; providing a fixed voltage over the electrical path at a known current, and measuring the drop in voltage to verify that doping levels are within desired parameters; and, placing an alternating current (AC) voltage within the electrical path and measuring the increase in current to determine capacitance, which indicates displacement of the plates within the MEM devices of the MEM device assemblies.

Verification of Charge and Discharge of MEM Device Assembly

Figure 6:
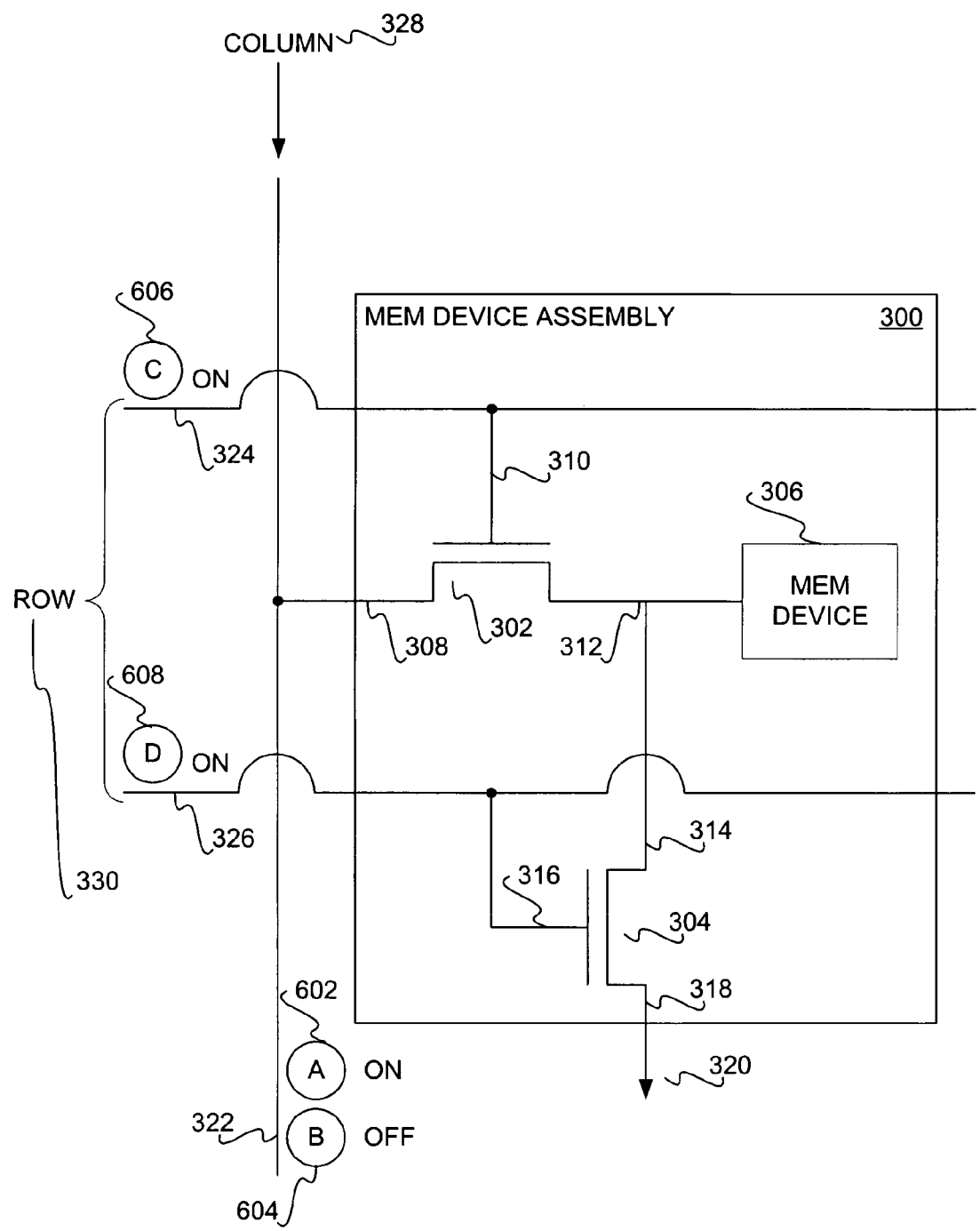
FIG. 6 is a diagram illustratively depicting how charge and discharge of the representative MEM device assembly of FIG. 3 can be verified, according to an embodiment of the invention.

FIG. 6 illustratively depicts how the testing mechanism 202, in combination with the row control mechanism 204, the column control mechanism 206 and column output mechanism 210 is able to verify proper column charge and discharge of the micro-electromechanical (MEM) device assembly 300. For illustrative clarity, however, neither the testing mechanism 202, the control mechanisms 204 and 206, nor the column output mechanism 210 is particularly depicted in FIG. 6. As can be appreciated by those of ordinary skill within the art, the manner by which charge and discharge of the MEM device assembly 300 is verified can be repeated for all of the MEM device assemblies of the array 124.

The testing mechanism 202, through the column control mechanism 206, charges, or asserts, the column 328, particularly the column line 322, as indicated by the letter A 602. Charging the column line 322 places a capacitive charge thereon. In this state the column output mechanism 210 may verify that the appropriate column voltage is present on the column line under test. The testing mechanism 202, again through the column control mechanism 206, then stops active assertion of the column 328, particularly the column line 322, as indicated by the letter B 604. However, the capacitive charge on the column line 322 remains.

Next, the testing mechanism 202, through the row control mechanism 204, charges, or asserts, the row lines 324 and 326 of the row 330, as indicated by the letters C 606 and D 608. Charging the row lines 324 and 326 turns on the switches 302 and 304 via the gates 310 and 316. The column line 322 is subsequently discharged to clear voltage 320 via switches 302 and 304. The testing mechanism 202 is able to directly measure the voltage at column line 322, and verify that the column line 322 has been appropriately discharged. That is, the testing mechanism 202 is able to confirm that switches 302 and 304 behave properly, by observing behavior of the voltages on the column line 322, and inferring therefrom correct performance of the switches 302 and 304. Furthermore, the testing mechanism 202 is able to verify that the column line 322 is discharged to the clear voltage 320 if and only if both the row control lines 324 and 326 are simultaneously asserted.

The testing accomplished by the testing mechanism 202 may be digital or analog. In analog testing, each column line is electrically coupled to an electrically observable point, such as a node or a pad, to allow measure of the voltage on the column line. By comparison, in digital testing, all of the column lines are captured digitally, such as by using a bank of flip-flops. The digital manner of testing provides for a slightly lower level of visibility, but allows for much faster testing than the analog manner of testing. The digital manner of testing provides for slightly lower visibility in that all that can be observed is whether the column line voltage is above a predetermined level, corresponding to a logical value of one, or below the same or a different predetermined level, corresponding to a logical value of zero. By comparison, in the analog manner of testing, the actual analog voltage level of a column line is measured.

Figure 7:
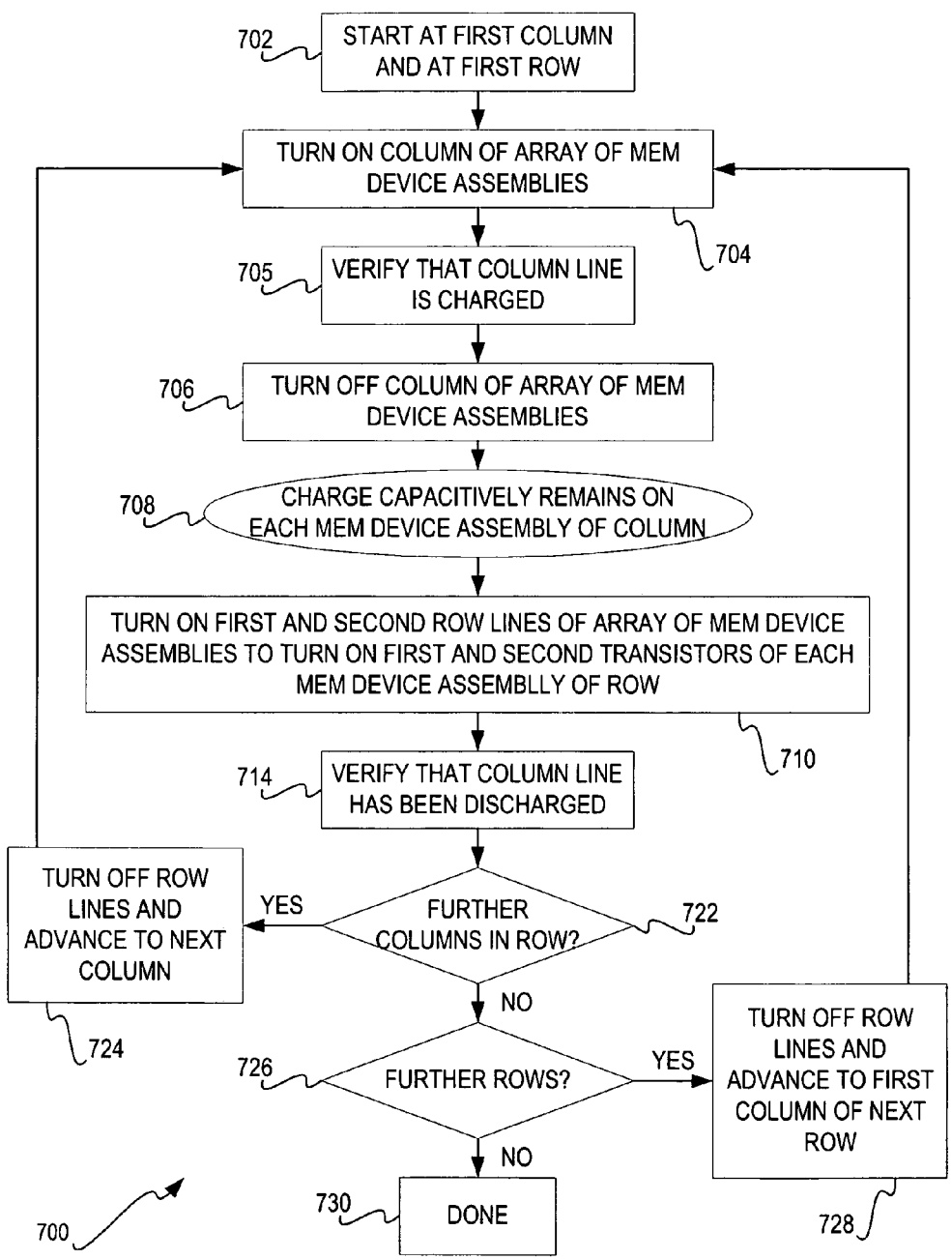
FIG. 7 is a flowchart of a method for verifying charge and discharge of each MEM device assembly of an array of MEM device assemblies, according to an embodiment of the invention.

FIG. 7 shows a method 700 for testing proper column charge and discharge of each MEM device assembly of the array of MEM device assemblies 124 by the testing mechanism 202, according to an embodiment of the invention. The method 700 is particularly described in relation to the MEM device assembly 300, for descriptive clarity. The method 700 starts at the first column and at the first row of the array of MEM device assemblies 124 (702).

This column of the array of MEM device assemblies 124 is turned on (704) to charge the column line of this column. For instance, the testing mechanism 202 may turn on the column through the column control mechanism 206. The testing mechanism 202, via the column output mechanism 210, then verifies that the appropriate voltage remains on the column line (705), in either a digital or an analog manner. The column is then turned off (706), such that a charge capacitively remains on the MEM device assemblies of the column (708). For instance, the testing mechanism 202 may turn off the column through the column control mechanism 206. In the case of the MEM device assembly 300, the column line 322 of the column 328 is turned on, tested, and then turned off. A capacitive charge remains on the column line 328.

Both row lines of the row of the array of MEM device assemblies 124 are turned on to turn on the first and the second transistors of each MEM device assembly of the row (710). For instance, the testing mechanism 202 may turn on the first and the second row lines of the row through the row control mechanism 204. In the case of the MEM device assembly 300, the row line 324 and the row line 326 of the row 330 are turned on to turn on the switch 302 of the MEM device assembly 300, via their gates 310 and 316. The first and second transistors of every other MEM device assembly of the row 330 are also turned on. Of all the MEM device assemblies of the row 330, an electrical path from column line 328 to clear voltage 320 exists only in the MEMS device assembly under test 300, allowing the column line 328 to be discharge to the clear voltage 320. Turning on of the first transistor of this selected MEM device assembly should transfer the charge capacitively on the column line of the column to the MEM device of the selected MEM device assembly, through the first transistor thereof. Turning on of the second transistor of this selected assembly should then discharge this charge to the clear voltage, through the second transistor thereof.

The testing mechanism 202 next verifies the proper operation of the selected MEM device assembly by confirming that the charge on the column line has been discharged (714). For example, in the case of the MEM device assembly 300, the testing mechanism 202 verifies that there is no longer a charge on the column line 322. That is, the charge capacitively on the column line 322 of the column 328 has properly transferred through the switch 302, through the switch 304, and to the clear voltage 320. The testing mechanism 202 is thus able to test the MEM device assembly 300 without directly or electrically reading the MEM device 306. In a sense, the circuitry associated with MEM device 306 is indirectly tested.

If there are further columns in the current row of MEM device assemblies being tested (722), then the testing mechanism 202 turns off the row lines of the current row and advances to the next column in this row (724). The method 700 is repeated beginning at 704. Once all of the columns in the current row of MEM device assemblies have been tested (722), if there are further rows of MEM device assemblies (726), then the testing mechanism 202 turns off the row lines of the current row and advances to the first column of the next row (728). The method is again repeated beginning at 704. Once all of the columns and rows of MEM device assemblies have been tested (726), the method 700 is finished (730). The method 700 of FIG. 7, an example depiction of which is shown in FIG. 6, thus indicates how the testing mechanism 202 is capable of verifying that each row of the MEM device assemblies is able to discharge each column thereof to ground upon the column having initially been charged, and how the testing mechanism 202 is capable of verifying that the column has indeed been initially charged.

The method 700 of FIG. 7 may be modified in other embodiments of the invention. For example, in an additional embodiment, testing time is reduced by first asserting a charge on all the column lines simultaneously, and then turning off active assertion of the charge on all the column lines such that the lines capacitively hold the original charge. The column voltages may be then be captured, such as digitally in parallel, where the testing mechanism 202 ensures that all the columns are appropriately charged. Both row lines for a given row may then be turned on, and the column voltages again captured, such as digitally in parallel, where the testing mechanism 202 ensures that all the columns have been appropriately discharged. Alternatively or additionally, just one or the other of the row lines for a given row may be turned on, and the column voltages again captured, such as digitally in parallel, where the testing mechanism 202 ensures that all the columns have not been discharged. The process outlined in this paragraph may be repeated for each row.

METHOD OF MANUFACTURE AND CONCLUSION

Embodiments of the invention have thus far been described in relation to a projection system having an array of micro-electromechanical (MEM) device assemblies, which are more generally deemed nodes, that have MEM devices serving to modulate light within the projection system for outward projection of image data. In other embodiments of the invention, however, a system may be implemented that is not a projection system, or a projector. In such embodiments of the invention, the MEM devices may or may not be spatial light modulators (SLM's). The description of embodiments of the invention that has been provided in relation to a projection system in which the MEM devices modulate light therein is also applicable to other embodiments of the invention that relate to systems other than projection systems, and which include MEM devices that may or may not modulate light.

FIG. 8 shows a method 800 for manufacturing, implementing, or otherwise providing a system having an array of nodes that contain MEM devices incapable of being read, according to an embodiment of the invention. As such, the method 800 is applicable both to projection systems in which the MEM devices modulate light, as well as to other types of systems in which the MEM devices may or may not modulate light. First, for each node within the array, a MEM device is provided, as well as first and second transistors (802). The MEM device and the transistors may be provided in the accordance with the topology depicted for the MEM device assembly 300 of FIG. 3, as has been described. The MEM device is incapable of being electrically read.

Next, a testing mechanism is situated outside of the array of nodes, and which is capable of testing each node for proper operation without directly electrically reading the MEM device of each node (804). For instance, the testing mechanism may verify that an electrical path exists within each node, as has been described in relation to FIGS. 4 and 5. The testing mechanism may also or instead verify appropriate charge and discharge of each node, as has been described in relation to FIGS. 6 and 7.

Finally, it is noted that, although specific embodiments have been illustrated and described herein, it will be appreciated by those of ordinary skill in the art that any arrangement is calculated to achieve the same purpose may be substituted for the specific embodiments shown. This application is intended to cover any adaptations or variations of the present invention. Therefore, it is manifestly intended that this invention be limited only by the claims and equivalents thereof.

We claim:

1. A system comprising:
    an array of micro-electromechanical (MEM) device assemblies, each MEM device assembly having a MEM device capable of being individually written to but incapable of being electrically read; and,
    a testing mechanism situated outside of the array of the MEM device assemblies to test each MEM device assembly for proper operation without directly reading the MEM device of the MEM device assembly.

2. The system of claim 1, wherein the testing mechanism is capable of verifying that an electrical path exists through each of the MEM device assemblies.

3. The system of claim 1, wherein the MEM device assemblies of the array are organized into columns and rows, and the testing mechanism is capable of verifying that each row of the MEM device assemblies is able to discharge each column of the MEM device assemblies upon the column of the MEM device assemblies having initially been charged.

4. The system of claim 1, wherein each MEM device assembly comprises:
    the MEM device;
    a first switch coupling a column control signal to the MEM device; and,
    a second switch coupling a clear voltage to the MEM device.

5. The system of claim 4, wherein each of the first switch and the second switch is a transistor.

6. The system of claim 4, wherein the MEM device of each MEM device assembly comprises at least one of: a light modulation MEM device and a digital light device (DLD).

7. The system of claim 6, wherein the system is a projection system in which light is modulated by the array of MEM device assemblies in accordance with image data from an image source and subsequently projected from the system.

8. The system of claim 1, wherein the MEM device assemblies of the array are organized into columns and rows, the system further comprising:
    a column control mechanism to select one or more of the columns of the MEM device assemblies; and,
    a row control mechanism to select one or more of the rows of the MEM device assemblies.

9. The system of claim 8, further comprising:
    a column output mechanism to receive test results from the one or more columns of the MEM device assemblies as tested by the testing mechanism; and,
    a row output mechanism to receive test results from the one or more rows of the MEM device assemblies as tested by the testing mechanism.

10. The system of claim 8, wherein the testing mechanism is communicatively coupled to the column control mechanism and the row control mechanism to charge selected one or more of the columns of the MEM device assemblies through the column control mechanism and to charge selected one or more of the rows of the MEM device assemblies through the row control mechanism.

11. The system of claim 8, wherein each of the column control mechanism and the row control mechanism comprises a multiplexer.

12. A system comprising:
    an array of nodes organized into rows and columns, each node having a micro-electromechanical (MEM) device incapable of being electrically read, a first switch coupling a column line to the MEM device and a second switch coupling a clear voltage to the MEM device; and,
    a testing mechanism situated outside of the array of nodes to test each node for proper operation by selecting a row and a column of the nodes in which the node is located to turn on the first and the second switches of the node and by verifying that an electrical path exists from the column, and through the first and the second switches, to the clear voltage.

13. The system of claim 12, wherein each row of the nodes comprises a first row line connected to a control of the first switch of each node of the row, and a second row line connected to a control of the second switch of each node of the row.

14. The system of claim 12, wherein each column of the nodes comprises a column line coupled to an input of the first switch of each node of the column.

15. The system of claim 12, wherein the first switch of each node has an input coupled to a column of the nodes in which the node is located, and the second switch of each node has an output coupled to a clear voltage.

16. The system of claim 12, wherein the testing mechanism further is to test each node for proper operation by verifying that each row of the nodes is able to discharge each column of the nodes to a clear voltage upon the column of the nodes having initially been charged.

17. The system of claim 12, wherein the system further comprises:
    a column control mechanism by which the testing mechanism is to select one or more of the columns of the nodes;
    a row control mechanism by which the testing mechanism is to select one or more of the rows of the nodes;
    a column output mechanism to receive test results from the one or more columns of the nodes as tested by the testing mechanism; and,
    a row output mechanism to receive test results from the one or more rows of the nodes as tested by the testing mechanism.

18. The system of claim 12, wherein the system is a projection system in which light is modulated by the array of MEM device assemblies in accordance with image data from an image source and subsequently projected from the system.

19. A system comprising:
    an array of micro-electromechanical (MEM) device assemblies, each MEM device assembly including a MEM device capable of being individually written to but incapable of being electrically read; and, means for testing each MEM device assembly for proper operation without directly reading the MEM device of the MEM device assembly.

20. The system of claim 19, wherein the means is further for verifying that an electrical path exists through each of the MEM device assemblies.

21. The system of claim 19, wherein the MEM device assemblies of the array are organized into columns and rows, and the means is further for verifying that each row of the MEM device assemblies is able to discharge each column of the MEM device assemblies to a clear voltage upon the column of the MEM device assemblies having initially been charged.

22. The system of claim 19, wherein the system is a projection system in which light is modulated by the array of MEM device assemblies in accordance with image data from an image source and subsequently projected from the system.

23. A method comprising:
charging a row of an array of micro-electromechanical (MEM) device assemblies organized into rows and columns to turn on a first transistor and a second transistor of each MEM device assembly of the row, each MEM device assembly including a MEM device capable of being individually written to but incapable of being electrically read;
charging a column of the array of MEM device assemblies;
verifying proper operation of the one MEM device assembly by confirming that an electrical path exists from the column, through the first transistor of the one MEM device assembly, through the second transistor of the one MEM device assembly, and to a clear voltage,
wherein a source of the first transistor of each MEM device assembly is connected to a column of the array, a drain of the first transistor of the MEM device assembly is connected to a drain of the second transistor of the MEM device assembly, and a source of the second transistor of the MEM assembly is connected to the clear voltage.

24. The method of claim 23, further comprising repeating the method for each successive column of the columns of the array and for each successive row of the rows of the array.

25. A method comprising:
turning on one or more columns of an array of micro-electromechanical (MEM) device assemblies organized into rows and columns to charge the column, each MEM device assembly including a MEM device capable of being individually written to but incapable of being electrically read;
verifying that the one or more columns of the array of MEM device assemblies properly received the charge;
turning off the one or more columns of the array of MEM device assemblies, such that a charge capacitively remains on each MEM device assembly of the one or more columns;
turning on a first row line of a row of the array of MEM device assemblies to turn on a first transistor of each MEM device assembly of the row;
turning on a second row line of the row of the array of MEM device assemblies to turn on a second transistor of each MEM device assembly of the row; and,
verifying that the one or more columns of the array of MEM device assemblies properly discharged the charge,
wherein a source of the first transistor of each MEM device assembly is connected to a column of the array, a drain of the first transistor of the MEM device assembly is connected to a drain of the second transistor of the MEM device assembly, and a source of the second transistor of the MEM assembly is connected to a clear voltage.

26. The method of claim 25, further comprising repeating the method for each successive column of the columns of the array and for each successive row of the rows of the array.

27. A method comprising:
providing, for each of an array of nodes organized into rows and columns, a micro-electromechanical (MEM) device incapable of being electrically read, a first transistor having a drain coupled to the MEM device, and a second transistor having a drain coupled to the MEM device; and,
situating a testing mechanism outside of the array of nodes that is capable of testing each node for proper operation by selecting a row and a column of the nodes in which the node is located to turn on the first and the second transistors of the node and by verifying that an electrical path exists from the column, through the first and the second transistors, and to a clear voltage.

28. The method of claim 27, wherein the testing mechanism further capable of testing each node for proper operation by verifying that each row of the nodes is able to discharge each column of the nodes to the clear voltage upon the column of the nodes having initially been charged.

* * * * *